J. SACHS

July 12, 1932. ELECTRIC CIRCUIT CONTROLLING APPLIANCE Re. 18,524

Original Filed July 18, 1927 2 Sheets-Sheet 1

Inventor
Joseph Sachs
By S. Jay Teller
Attorney

J. SACHS

July 12, 1932. ELECTRIC CIRCUIT CONTROLLING APPLIANCE Re. 18,524

Original Filed July 18, 1927 2 Sheets-Sheet 2

Inventor
Joseph Sachs
By S. Jay Teller
Attorney

Reissued July 12, 1932

Re. 18,524

UNITED STATES PATENT OFFICE

JOSEPH SACHS, OF WEST HARTFORD, CONNECTICUT

ELECTRIC CIRCUIT CONTROLLING APPLIANCE

Original application filed July 18, 1927, Serial No. 206,732. Renewed December 7, 1929. Original No. 1,755,369, dated April 22, 1930. Application for reissue filed April 27, 1932. Serial No. 607,848.

The invention relates to a circuit controlling appliance and particularly to a fused switch and the invention is especially applicable to a fused switch enclosed in a casing or cabinet. A fused switch embodying the present invention is in some respects similar to the fused switches disclosed in my patents for electric circuit controlling appliances No. 1,754,443 and No. 1,754,445 dated April 15, 1930 and No. 1,755,367 dated April 22, 1930.

One object of the present invention is to provide a fused switch of the same general type as disclosed in the aforesaid patents but having the essential parts thereof differently disposed in relation to each other in order to provide compactness and simplicity. In accordance with the invention there is provided an insulating base upon the front face of which the fuse and switch parts are mounted, the switch parts being at one side of the corresponding fuse parts.

Another object of the invention is to provide a switch having a rectilinearly movable switching member as disclosed in the aforesaid patents, and having improved relatively movable means for releasably holding the movable switching member in its normal path of movement.

In the accompanying drawings I have shown two embodiments of the invention but it is to be understood that the drawings are intended for illustrative purposes only and are not to be construed as defining or limiting the scope of the invention, the claims forming a part of this specification being relied upon for that purpose.

Figure 1:
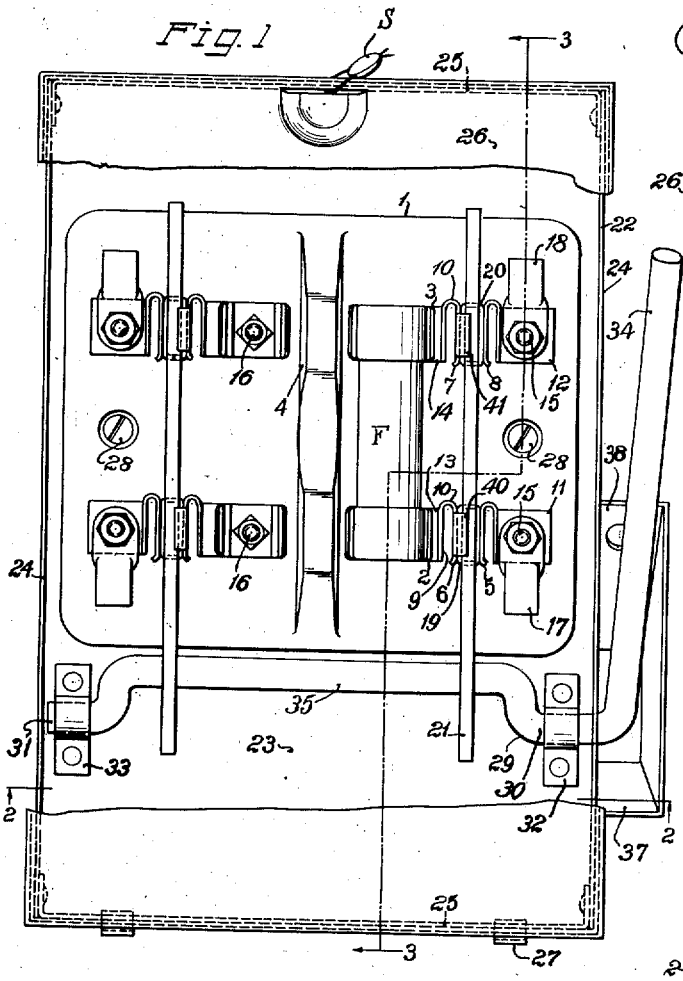
Fig. 1 is a front view of an appliance embodying the invention, parts of the enclosing cabinet being broken away to show the interior construction.
Figure 3:
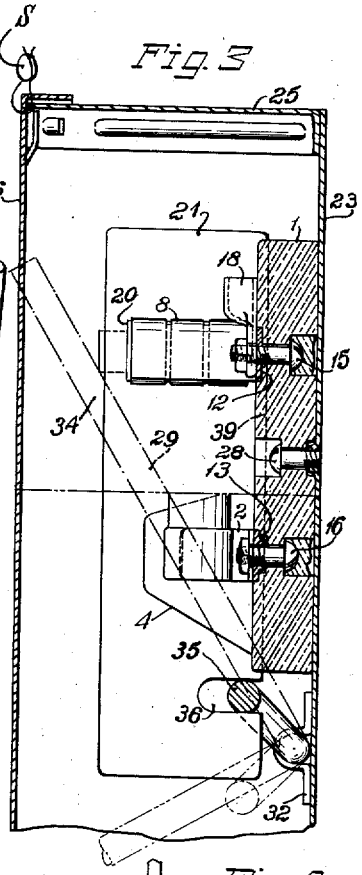
Fig. 3 is a vertical sectional view taken along the line 3—3 of Fig. 1.
Figure 2:
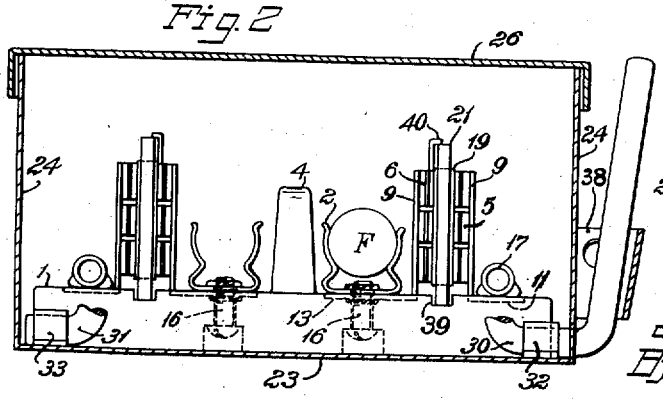
Fig. 2 is a bottom view of the parts shown in Fig. 1, the enclosing cabinet being shown in section along the line 2—2 of Fig. 1.
Figure 6:
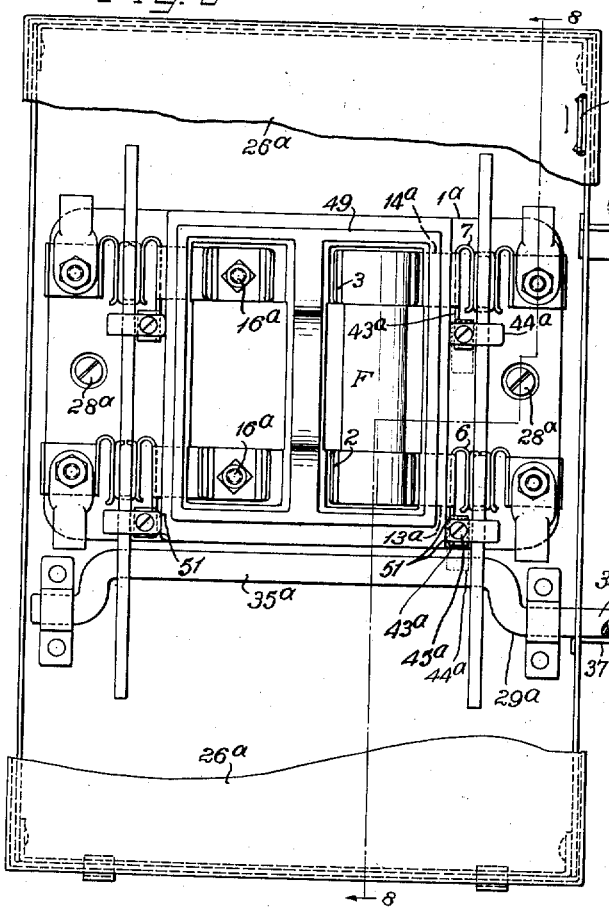
Figure 8:
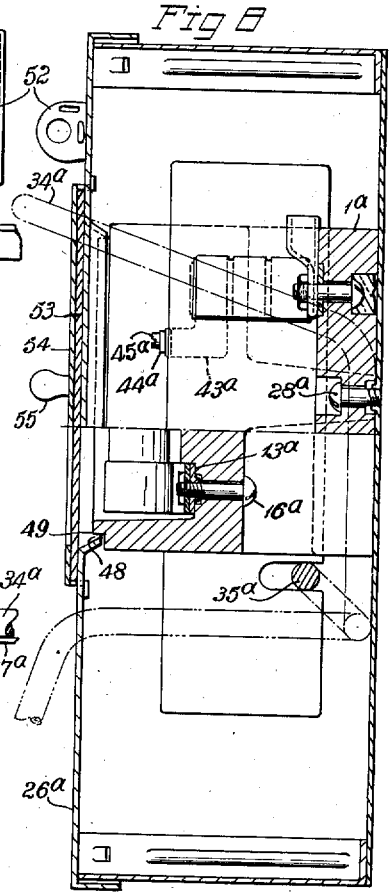
Figure 7:
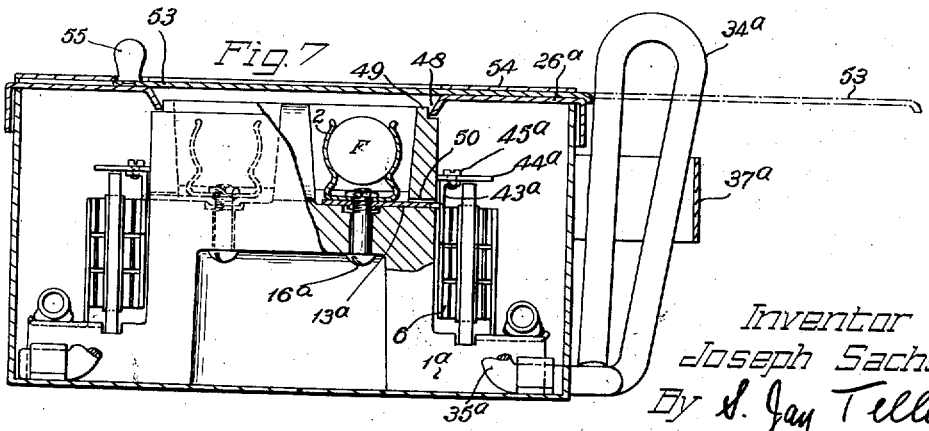

Figs. 6, 7 and 8 are views similar respectively to Figs. 1, 2 and 3 but showing an alternate embodiment of the invention. The section of Fig. 8 is taken along the line 8—8 of Fig. 6.

In the drawings there are shown two pairs of fuse contacts and two separate switching devices but it will be understood that the invention is not necessarily limited to any particular number of fuses and switches. The fuse and switch parts are shown symmetrically disposed with respect to the vertical central plane of the appliance and for the sake of convenience and simplicity of description I will in the main confine the description to those parts at one side of the said plane, it being understood that the parts at the other side are or may be the same in construction except for reversal of positions.

There is provided a base 1 of insulating material having its front face adapted for the mounting of electrical parts as will presently be described. Some or all of the several fuse and switch contacts of the appliance are mounted on the base. The base is preferably relatively thin and it is adapted to be mounted directly upon a supporting wall with its rear face in direct contact with the said supporting wall. The supporting wall may be the rear wall of an enclosing cabinet.

Mounted upon the front face of the base is at least one of the two fuse receiving contacts 2 and 3. As illustrated both contacts are mounted on the base, but the invention is not necessarily so limited. I have shown contacts which are vertically spaced from each other and which are adapted for receiving a cartridge enclosed fuse such as F but it will be understood that I do not necessarily limit myself to contacts for receiving a fuse of this type. When there are two pairs of fuse contacts as shown they are preferably separated by a barrier 4 formed integrally with the base 1.

The appliance also comprises at least one pair of stationary switch contacts arranged with the contacts of each pair in opposed relationship. As shown there are two pairs of such switch contacts, but it will be understood that the invention is not necessarily so limited. When there are two pairs they are preferably vertically spaced from each other.

In accordance with one phase of the invention the switch contacts are mounted on the front face of the base 1 and are located at one side of the fuse contacts 2 and 3. As shown the contacts of the lower pair are designated by 5 and 6 and the contacts of the upper pair are designated by 7 and 8. Each stationary switch contact includes a portion 9 which extends perpendicularly forward from the front face of the base and each of them as shown also includes a U-shaped portion 10 which is carried by the portion 9. The U-shaped portions 10 of each pair of contacts are oppositely disposed to provide two opposed parallel contact surfaces. The two portions 9 and 10 of each contact may be formed integrally with each other and they are so shown, but it will be understood that I do not limit myself to this integral construction. Suitable provision is made for mounting each contact upon the base and preferably and as shown there is provided a portion which is formed integrally with the portion 9 of the contact and which extends at right angles to the said portion 9 along the face of the base. The mounting portions connected with the contacts 5 and 8 are designated by 11 and 12 respectively and the mounting portions connected with the contacts 6 and 7 are designated by 13 and 14 respectively. Screws 15, 15 are associated with the portions 11 and 12 and thus hold the contacts 5 and 8 in place. Screws 16, 16 engage the portions 13 and 14 and thus hold the contacts 6 and 7 in place.

In order that a suitable electrical connection may be established through the fused switch appliance provision is made for electrically connecting one switch contact of one pair with a fuse contact. When there are two pairs of switch contacts one contact of each pair is connected with the corresponding fuse contact, that is, the contacts 6 and 7 are connected with the corresponding fuse contacts 2 and 3. Such electrical connection can be made in various ways but preferably and as illustrated the two strips 13 and 14 are extended laterally so as to underlie and directly engage with the said fuse contacts. The aforesaid screws 16, 16 serve to connect the respective fuse contacts with the corresponding strips as shown. There are provided two wire connecting terminals 17 and 18 which are connected respectively with the strips 10 and 11. These terminals are thus electrically connected with the respective contacts 4 and 6.

For establishing or breaking electrical connection between the switch contacts of each pair I provide a switching element which is rectilinearly movable parallelly with the front face of the base. When there are two pairs of stationary switch contacts as shown there are two movable conducting switching elements or contacts 19 and 20 insulated from each other and adapted respectively to engage or disengage the said stationary switch contacts 5, 6 and 7, 8. The two movable switching contacts 19 and 20 are preferably carried by an insulating element 21 which with the said movable contacts constitutes a rectilinearly movable switching member. The insulating element 21 is preferably in the form of a flat plate, the said contact elements 19 and 20 extending through it and projecting somewhat beyond the opposed surfaces thereof as shown. The details of the switching member may be as shown in my said Patent No. 1,754,443. With the stationary switch contacts located as shown and as described the said flat insulating element is arranged perpendicularly to the front face of the base 1.

From the foregoing description it will be apparent that when the switching member is in the "on" position as shown in Fig. 1 a circuit will be established from the wire connecting terminal 17 through the switch contacts 5, 19 and 6 to the fuse contact 2. Similarly a connection is established from the fuse contact 3 through the switch contacts 7, 20 and 8 to the other wire connecting terminal 18. When the switching member is moved downward from the position shown in Fig. 1 the movable contacts 19 and 20 will be disengaged from the stationary switch contacts and the circuit will be broken at two points at each side of the fuse thus making a total of four breaks. The insulating element 21 of the switching member serves not only as a carrier for the contacts 19 and 20 but it also serves as a barrier which is moved between the opposite stationary contacts immediately upon the disengagement of the corresponding movable contact 19 or 20 therefrom. The switching member is entirely free to adjust itself laterally to conform to the positions of the several stationary switch contacts. If there are any defects in the initial construction or mounting of the stationary contacts or in the subsequent adjustment thereof the switching member will conform thereto and will at all times effect firm engagement with the contacts and will establish effective electrical connections therewith.

Preferably the fused switch unit described is enclosed in a casing or cabinet this ordinarily being so constructed that it can be sealed so as to prevent unauthorized access to any of the parts. I have shown an enclosing cabinet 22 of sheet metal having a rear wall 23, side walls 24, 24 and end walls 25, 25. The cabinet has an openable front cover 26 which is shown as being hinged at 27 to the bottom end wall 25. The base 1 is secured to the rear wall 23 of the cabinet by means of screws 28, 28. Suitable provision is made as indicated at S for sealing the cover in closed position.

A means is provided for operating the switching member or members and when there is an enclosing cabinet such as 22 the said means includes a handle located externally of the cabinet so that the switch can be operated when the cover of the cabinet is closed. The cabinet may be utilized as a means for supporting the switch operating means and as shown there is an operating spindle comprising a rod 29 including two pivot sections 30 and 31 which are mounted in bearing clips 32 and 33 secured to the back wall 23 of the cabinet. The rod 29 is bent to form a manually operable handle 34 outside of the cabinet and also to form a crank section 35 inside of the cabinet and between the pivot sections. The crank section is operatively connected with the movable switch member and for this purpose I have shown in the insulating element 21 of each switching member a slot 36 adapted to receive the said crank section 35. The slot 36 is preferably open at one end, that is, at the back end, so as to facilitate assembly or disassembly.

From the foregoing description it will be obvious that by moving the handle 34 each of the switch members can be moved longitudinally upward or downward as described. With the handle 34 in its uppermost position as shown in Figs. 2 and 3 the switching members will be held in their uppermost positions thus completing the circuit through the appliance. When the handle is moved to its lowermost position the switching members will be moved to their lowermost positions thus separating the movable contacts 18 and 19 from the stationary contacts 5, 6 and 7, 8 respectively and thus breaking each leg of the circuit at four points as already described. Stops 37 and 38 are provided for limiting the throw of the handle and thus limiting the movement of the switching members.

A fixed guiding means is provided for one edge of the insulating element 21 of the switching member and preferably this guiding means consists of a portion of the insulating base 1. As illustrated the base is provided with a groove 39 into which the insulating element extends. Another guiding means is provided which engages the opposite edge of the insulating element, that is, the front edge. The construction and mounting of this second guiding means may be widely varied but in Figs. 1 to 3 I have shown a guiding means which comprises two extensions 40 and 41 formed respectively on two of the stationary switch contacts as, for instance, on the contacts 6 and 7. Each of these extensions is formed with a lip which extends transversely so as to engage the front edge of the insulating member. It will be obvious that the extensions 40 and 41 ordinarily prevent any movement of the switching member in the forward direction out of its normal path of movement. However, the extensions 40 and 41 overlap the insulating element 21 only to a slight extent and the entire switching member can be readily removed at any time by forcing it laterally sufficiently to disengage the insulating element from the said extensions 40 and 41. The switching member is thus freely removable for inspection or cleaning and the removal of the switching member facilitates inspection and cleaning of the stationary contacts.

Figure 4:
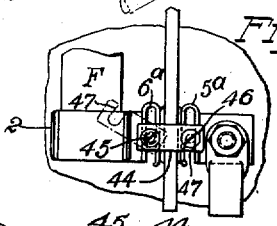
Fig. 4 is a fragmentary view similar to Fig. 1 but showing an alternate embodiment of the invention.
Figure 5:
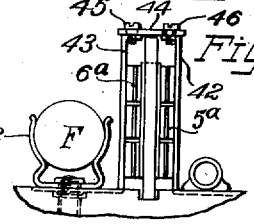
Fig. 5 is a fragmentary view similar to Fig. 2 and showing the same construction as Fig. 4.

In Figs. 4 and 5 I have shown another form of guiding means adapted to engage one edge of the insulating element of the switching member and this guiding means is so mounted as to be movable with respect to the path of movement of the switching member and with respect to the plane of the insulating element 21. As concerns the relatively movable guiding means as shown in Figs. 4 and 5 I do not necessarily limit myself to a fused switch as the movable guiding means as shown may be used in a switch having no provision for receiving a fuse.

Preferably the movable guiding means for the switching member is carried upon the stationary switch contacts and is vertically movable laterally, but this is not essential. As illustrated, however, the two contacts of each pair as, for instance, the contacts $5^a$ and $6^a$ are provided with upward extensions 42 and 43 each provided with an angular flange. A guiding element 44 of insulating material is mounted on the flanges of those extensions so as to be laterally movable and as shown it is pivotally connected with one of them as, for instance, the extension 43. Preferably the pivotal connection is effected by means of a screw 45 and a similar screw 46 is carried by the extension 42. The guiding element 44 is provided with a slot 47 receiving the screw 46, the slot permitting the guiding element to be swung laterally to a position such as shown by dotted lines in Fig. 4 without removing the screw 46. By tightening the screw the guiding element may be clamped in the position shown by full lines in Fig. 4.

It will be understood that, when there are two pairs of switch contacts, two guiding elements 44 are preferably provided, one being carried by the lower switch contacts and the other being carried by the upper switch contacts. By releasing the screws 46 and swinging the guiding elements laterally to positions such as shown by dotted lines in Fig. 4 the switching element is released for free forward movement. The said members 44, 44 are moved entirely independently of the fuse contacts, and the switching member may be removed without disturbing the fuse contacts.

In Figs. 6, 7 and 8 I have shown a construction which is similar in principle to that shown in Figs. 1, 2 and 3 but which differs essentially in that the fuses are located near the front so as to be accessible, if desired, through an opening in the front wall or cover in the cabinet while the cabinet is closed.

It will be observed that, as shown in Figs. 6, 7 and 8, the front cover 26ª of the cabinet is provided with an opening 48 therein, and that the base 1ª has a forward extending portion 49 which closes the said opening 48 when the cover 26ª is closed. The fuse contacts 2 and 3 are mounted on the forward projecting portion 49 of the base so as to be accessible through the opening 48 in the cover. There are preferably two pairs of such contacts as shown. The base is secured in place in the cabinet by means of screws 28ª, 28ª.

The stationary switch contacts and the movable switching members are located at opposite sides of the projection 49 on the base and may be substantially the same in construction as already fully described in connection with Figs. 1 to 3. When there are two pairs of stationary switch contacts as shown, the contacts 6 and 7 may include mounting portions 13ª and 14ª which extend laterally from the tops of the contacts through recesses 50 in the base so as to contact with the corresponding fuse clips 2 and 3. The said mounting portions and the said fuse clips are held in place by means of screws 16ª, 16ª.

The means for preventing the forward movement of the movable switching members may be as shown in Figs. 1 to 3 but I have shown a construction, somewhat similar to that shown in Figs. 4 and 5. Each of the stationary switch contacts 6 and 7 is provided with an upward extension 43ª having a laterally extending flange to which a guiding element 44ª preferably of insulating material is pivoted by means of a screw 45ª. As clearly shown in Fig. 6, each guiding element 44ª is normally held in the position shown by full lines by reason of its engagement or substantial engagement with the wall of extension 49 of the base 1ª. The corners 51, 51 of the element 44ª normally prevent any considerable movement of the said element about its pivotal axis. However, the resiliency of the extension 43ª is such as to permit each element 44ª to be moved either upward or downward as, for instance, to a position such as shown by dotted lines in Fig. 6. With both of the corresponding guiding elements 44ª positioned as shown in Fig. 9 the movable element of either switching means is free to be removed in the forward direction.

The enclosing cabinet is or may be the same as already described except for the front cover thereof. The said cover has an opening therein as already described, and it may if desired be held closed by means of a latch 52 and the means for operating the switching members from the exterior of the cabinet may be similar to that already described although differing in details. I have shown an operating spindle 29ª which includes a handle 34ª on the exterior of the cabinet and a cranked section 35ª on the interior thereof. When the handle 34ª is in the uppermost position shown in Fig. 8 the switches are closed. When the handle 34ª is moved in the lowermost position shown in Fig. 8 the switching members are moved downward and the switches are opened. A stop member 37ª is provided for limiting the movement of the handle 34ª.

As already stated the opening 48 in the cover 26ª is closed by the base extension 49 when the cover is closed. As the result of this construction it is impossible to get access to interior of the cabinet or to any of the live electrical parts therein except the fuse contacts after the cover has been closed and sealed. For normally externally closing the opening 48 I preferably provide a transversely or laterally slidable auxiliary cover 53 which is held and guided by means of a member 54. The cover 53 is provided with a knob 55 by means of which it may be moved laterally. With the parts in the position shown by full lines the auxiliary cover is obstructed by the handle 34ª so that the auxiliary cover cannot be opened to expose the fuses so long as the handle 34ª remains in the switch closing position. However, when the handle is moved downward so as to move the switching members downward to open the circuit the auxiliary cover 53 is then free to be moved laterally toward the right to permit access to the fuse contacts and the fuses; but with the cover thus moved laterally it is impossible to move the handle 34ª to close the circuit. The interlocked cover and handle construction as disclosed does not of itself constitute any part of the present invention, being set forth in my patents for inclosed fused switch, No. 1,721,494 and No. 1,721,495 dated July 16, 1929.

What I claim is:

1. In a fused switch appliance, the combination of an insulating base, two fuse receiving contacts directly mounted upon the base at the front thereof, two pairs of opposed stationary switch contacts carried by the base at the front thereof and at one side of the fuse contacts, conducting means for electrically connecting one switch contact of each pair with its corresponding fuse contact, a rectilinearly movable switching member comprising an insulating element and two conducting elements carried by the insulating element and normally engaging the said switch contacts of the corresponding pairs to establish a circuit through the appliance, means normally engaging the insulating element of the said member to prevent forward movement thereof, and means for rectilinearly moving the switching member approximately parallelly with the front face of the base to engage the conducting elements thereof with the stationary switch contacts or to disengage them therefrom.

2. In a fused switch appliance, the combination of an insulating base, two vertically spaced fuse receiving contacts directly mounted upon the base at the front thereof and adapted for receiving a cartridge enclosed fuse, two vertically spaced pairs of opposed stationary switch contacts carried by the base at one side of the fuse contacts, each of the contacts including a portion extending forward perpendicularly to the front face of the base and one of the contacts of each pair including a strip formed integrally with the last said portion and extending laterally into direct engagement with the corresponding fuse contact, a rectilinearly movable switching member comprising an insulating element and two conducting elements carried by the insulating element and normally engaging the said switch contacts of the corresponding pairs to establish a circuit through the appliance, means normally engaging the insulating element of the said member to prevent forward movement thereof, and means for rectilinearly moving the switching member approximately parallelly with the front face of the base to engage the conducting elements thereof with the stationary switch contacts or to disengage them therefrom.

3. In a fused switch appliance, the combination of an insulating base, two fuse receiving contacts directly mounted upon the base at the front thereof, two pairs of opposed stationary switch contacts carried by the base at the front thereof, and at one side of the fuse contacts, a rectilinearly movable switching member comprising an insulating element and two conducting elements carried by the insulating element and normally engaging the said switch contacts of the corresponding pairs to establish a circuit through the appliance, means carried by the stationary switch contacts and normally engaging the insulating element of the said member to prevent forward movement thereof, and means for rectilinearly moving the switching member approximately parallelly with the front face of the base to engage the conducting elements thereof with the stationary switch contacts or to disengage them therefrom.

4. In an enclosed fused switch, the combination of an enclosing cabinet having an openable front cover with an opening therein, an insulating base within the cabinet having a forward extending portion thereof positioned to normally close the said opening when the cover is closed, a pair of fuse receiving contacts mounted on the said portion of the base and accessible through the said opening, two pairs of opposed stationary switch contacts carried by the base at one side of the said forward extending portion thereof, a rectilinearly movable switching member comprising an insulating element and two conducting elements carried by the insulating element and normally engaging the stationary switch contacts of the corresponding pairs to establish a circuit through the appliance, means normally engaging the insulating element of the said member to prevent forward movement thereof, and means operable from the exterior of the cabinet for rectilinearly moving the switching member approximately parallelly with the front cover to engage the conducting elements thereof with the stationary switch contacts or to disengage them therefrom.

5. In an electric switch, the combination of two pairs of opposed stationary switch contacts, a rectilinearly movable switching member comprising a flat insulating element and two conducting elements carried by the insulating element and normally engaging the said switch contacts of the corresponding pairs to establish a circuit through the appliance, fixed guiding means engaging the insulating element of the switching member at one edge, other guiding means normally engaging the insulating element of the said member at the other edge thereof, the last said means being movable out of engaging position transversely of the plane of the insulating element to permit removal of the switching member out of its normal path of movement, and means for moving the switching member rectilinearly between the two said guiding means to engage the conducting elements thereof with the stationary switch contacts or to disengage them therefrom.

6. In an electric switch, the combination of two pairs of opposed stationary switch contacts, a rectilinearly movable switching member comprising an insulating element and two conducting elements carried by the insulating element and normally engaging the said switch contacts of the corresponding pairs to establish a circuit through the appliance, fixed guiding means engaging the insulating element of the switching member at one edge, other guiding means normally engaging the insulating element of the said member at the other edge thereof, the last said means being pivotally mounted at one side of the said element and being movable about its pivot out of engaging position to permit removal of the said member out of its normal path of movement, and means for moving the switching member rectilinearly between the two said guiding means to engage the conducting elements thereof with the stationary switch contacts or to disengage them therefrom.

7. In an electric switch, the combination of two pairs of opposed stationary switch contacts, a rectilinearly movable switching member comprising a flat insulating element and two conducting elements carried by the insulating element and normally engaging the said switch contacts of the corresponding pairs to establish a circuit through the appliance, fixed guiding means engaging the insulating element of the switching member at one edge, other guiding means carried entirely by the said contacts and normally engaging the insulating element of the said member at the other edge thereof, the last said means being movable out of engaging position transversely of the plane of the insulating element to permit removal of the switching member out of its normal path of movement, and means for moving the switching member rectilinearly between the two said guiding means to engage the conducting elements thereof with the stationary switch contacts or to disengage them therefrom.

8. In a fused switch appliance, the combination of an insulating base, two fuse receiving contacts on the base, two pairs of opposed stationary switch contacts, conducting means for electrically connecting one switch contact of each pair with its corresponding fuse contact, a rectilinearly movable switching member comprising an insulating element and conducting elements carried by the insulating element and normally engaging the said switch contacts of the corresponding pairs to establish a circuit through the appliance, fixed guiding means engaging the insulating element of the switching member at one edge, other guiding means additional to the said base and normally engaging the insulating element of the said member at the other edge thereof, the last said means being movable out of engaging position to permit removal of the switching member, and means for moving the switching member rectilinearly between the two said guiding means to engage the conducting elements thereof with the stationary switch contacts or to disengage them therefrom.

9. In a fused switch appliance, the combination of an insulating base, two fuse receiving contacts on the base, two pairs of opposed stationary switch contacts, conducting means for electrically connecting one switch contact of each pair with its corresponding fuse contact, a rectilinearly movable switching member comprising a flat insulating element and two conducting elements carried by the insulating element and normally engaging the said switch contacts of the corresponding pairs to establish a circuit through the appliance, fixed guiding means engaging the insulating element of the switching member at one edge, other guiding means additional to the said base and normally engaging the insulating element of the said member at the other edge thereof, the last said means being movable out of engaging position transversely of the plane of the insulating element to permit removal of the switching member, and means for moving the switching member rectilinearly between the two said guiding means to engage the conducting elements thereof with the stationary switch contacts or to disengage them therefrom.

10. In a fused switch appliance, the combination of an insulating base, two fuse receiving contacts mounted upon the base at the front thereof, two pairs of opposed stationary switch contacts carried by the base at the front thereof and at one side of the fuse contacts, conducting means for electrically connecting one switch contact of each pair with its corresponding fuse contact, a rectilinearly movable switching member comprising an insulating element and two conducting elements carried by the insulating element and normally engaging the said switch contacts of the corresponding pairs to establish a circuit through the appliance, the said insulating element being guided at one edge by the base, guiding means additional to the said base and normally engaging the insulating element of the said member at the other edge thereof, the last said means being carried by the switch contacts and being movable out of engaging position to permit removal of the switching member, and means for moving the switching member rectilinearly between the base and the said guiding means to engage the conducting elements thereof with the stationary switch contacts or to disengage them therefrom.

11. In a fused switch appliance, the combination of an insulating base, two fuse receiving contacts mounted upon the base at the front thereof, two pairs of opposed stationary switch contacts carried by the base at the front thereof and at one side of the fuse contacts, conducting means for electrically connecting one switch contact of each pair with its corresponding fuse contact, a rectilinearly movable switching member comprising a flat insulating element and two conducting elements carried by the insulating element and normally engaging the said switch contacts of the corresponding pairs to establish a circuit through the appliance, fixed guiding means engaging the insulating element of the switching member at one edge, other guiding means additional to the said base and normally engaging the insulating element of the said member at the other edge thereof, the last said means being movable out of engaging position transversely of the plane of the insulating element to permit removal of the switching member, and means for moving the switching member rectilinearly between the two said guiding means to engage the conducting elements thereof with the stationary switch contacts or to disengage them therefrom.

12. In a fused switch appliance, the combination of an insulating base, two fuse receiving contacts of which one is directly mounted upon the base at the front thereof, a pair of opposed stationary switch contacts carried by the base at the front thereof and immediately adjacent the fuse contact thereon, conducting means for electrically connecting one switch contact with the last said fuse contact, a rectilinearly movable switching member comprising an insulating element and a conducting element carried by the insulating element and normally engaging the said switch contacts to establish a circuit through the appliance, means normally engaging the insulating element of the said member to prevent forward movement thereof, and means for rectilinearly moving the switching member approximately parallelly with the front face of the base to engage the conducting element thereof with the stationary switch contacts or to disengage it therefrom.

13. In a fused switch appliance, the combination of an insulating base having a forward projection thereon, two fuse receiving contacts of which one is directly mounted on the front of the projection on the base, a pair of opposed stationary switch contacts carried by the base at the front thereof and at one side of the said projection, one switch contact having a lateral extension therefrom which engages and provides electrical connection with the fuse contact on the projection, a rectilinearly movable switching member comprising an insulating element and a conducting element carried by the insulating element and normally engaging the said switch contacts to establish a circuit through the appliance, means normally engaging the insulating element of the said member to prevent forward movement thereof, and means for rectilinearly moving the switching member approximately parallelly with the front face of the base to engage the conducting element thereof with the stationary switch contacts or to disengage it therefrom.

14. In an electric switch, the combination of a pair of opposed stationary switch contacts, a rectilinearly movable switching member comprising a flat insulating element and a conducting element carried by the insulating element and normally engaging the said switch contacts to establish a circuit through the appliance, fixed guiding means engaging the insulating element of the switching member at one edge, other guiding means normally engaging the insulating element of the said member at the other edge thereof, the last said means being movable out of engaging position transversely of the plane of the insulating element to permit removal of the switching member out of its normal path of movement, and means for moving the switching member rectilinearly between the two said guiding means to engage the conducting element thereof with the stationary switch contacts or to disengage it therefrom.

15. In an electric switch, the combination of a pair of opposed stationary switch contacts, a rectilinearly movable switching member comprising an insulating element and a conducting element carried by the insulating element and normally engaging the said switch contacts to establish a circuit through the appliance, fixed guiding means engaging the insulating element of the switching member at one edge, other guiding means normally engaging the insulating element of the said member at the other edge thereof, the last said means being pivotally mounted at one side of the said element and being movable about its pivot out of engaging position to permit removal of the said member out of its normal path of movement, and means for moving the switching member rectilinearly between the two said guiding means to engage the conducting element thereof with the stationary switch contacts or to disengage it therefrom.

16. In a fused switch appliance, the combination of two stationary fuse receiving contacts, a pair of opposed stationary switch contacts, conducting means for electrically connecting one switch contact with one fuse contact, a rectilinearly movable switching member comprising an insulating element and a conducting element carried by the insulating element and normally engaging the said switch contacts to establish a circuit through the appliance, fixed guiding means engaging the insulating element of the switching member at one edge, other guiding means normally engaging the insulating element of the said member at the other edge thereof, the last said means being movable out of engaging position independently of either fuse contact to permit removal of the switching member, and means for moving the switching member rectilinearly between the two said guiding means to engage the conducting element thereof with the stationary switch contact or to disengage it therefrom.

17. In a fused switch appliance, the combination of two stationary fuse receiving contacts, an insulating base, a pair of opposed statitonary switch contacts on the base, conducting means for electrically connecting one switch contact with one fuse contact, a rectilinearly movable switching member comprising an insulating element and a conducting element carried by the insulating element and normally engaging the said switch contacts to establish a circuit through the appliance, the said insulating element of the switching member having engagement at its rear edge with the base to be guided thereby, guiding means additional to the said base and normally engaging the insulating element of the said member at the front edge thereof, the last said means being movable out of engaging position independently of either fuse contact to permit removal of the switching member in the forward direction, and means for moving the switching member rectilinearly between the base and the said guiding means to engage the conducting element thereof with the stationary switch contacts or to disengage it therefrom.

18. In a fused switch appliance, the combination of an insulating base, two stationary fuse receiving contacts of which one is carried by the base, a pair of opposed stationary switch contacts on the base, conducting means for electrically connecting one switch contact with the said fuse contact on the base, a rectilinearly movable switching member comprising an insulating element and a conducting element carried by the insulating element and normally engaging the said switch contacts to establish a circuit through the appliance, the said insulating element of the switching member having engagement at its rear edge with the base to be guided thereby, guiding means additional to the said base and normally engaging the insulating element of the said member at the front edge thereof, the last said means being movable out of engaging position independently of either fuse contact to permit removal of the switching member in the forward direction, and means for moving the switching member rectilinearly between the base and the said guiding means to engage the conducting element thereof with the stationary switch contacts or to disengage it therefrom.

19. In a fused switch appliance, the combination of an insulating base, two fuse receiving contacts of which one is directly mounted on the base at the front thereof, a pair of opposed stationary switch contacts mounted on the base at the front thereof and at one side of the fuse contacts, conducting means for electrically connecting one switch contact with the said fuse contact on the base, a rectilinearly movable switching member comprising an insulating element and a conducting element carried by the insulating element and normally engaging the said switch contacts to establish a circuit through the appliance, the said insulating element being guided at its rear edge by the base, guiding means additional to the said base and normally engaging the insulating element of the said member at the front edge thereof, the last said means being movable out of engaging position independently of the fuse contacts to permit removal of the switching member in the forward direction, and means for moving the switching member rectilinearly between the base and the said guiding means to engage the conducting element thereof with the stationary switch contacts or to disengage it therefrom.

20. In a fused switch appliance, the combination of an insulating base, a pair of opposed stationary switch contacts carried by the base at the front thereof, each of the said contacts comprising a single piece of metal including a contact portion perpendicular to the front of the base and a mounting portion at right angles to the contact portion and engaging the base, a pair of spaced fuse contacts one of which is in direct engagement with one of the said single-piece switch contacts, a rectilinearly movable switching member comprising an insulating element and a conducting element carried by the insulating element and normally engaging the said switch contacts to establish a circuit through the appliance, means normally engaging the insulating element of the said member to prevent forward movement thereof, and means for rectilinearly moving the switching member approximately parallelly with the front face of the base to engage the conducting element thereof with the stationary switch contacts or to disengage it therefrom.

21. In a fused switch appliance, the combination of an insulating base, two pairs of opposed stationary switch contacts carried by the base at the front thereof, each of the said contacts comprising a single piece of metal including a contact portion perpendicular to the front of the base and a mounting portion at right angles to the contact portion and engaging the base, a pair of spaced fuse contacts each in direct engagement with one of the said single-piece switch contacts of the corresponding pair of such contacts, a rectilinearly movable switching member comprising an insulating element and two conducting elements carried by the insulating element and normally engaging the said switch contacts of the corresponding pairs to establish a circuit through the appliance, means normally engaging the insulating element of the said member to prevent forward movement thereof, and means for rectilinearly moving the switching member approximately parallelly with the front face of the base to engage the conducting elements thereof with the stationary switch contacts or to disengage them therefrom.

22. In a fused switch appliance, the combination of an insulating base, a pair of opposed stationary switch contacts carried by the base at the front thereof, each of the said contacts comprising a single piece of metal including a contact portion perpendicular to the front of the base and a mounting portion at right angles to the contact portion and engaging the base, a pair of spaced fuse contacts one of which is in direct engagement with one of the said single-piece switch contacts, a rectilinearly movable switching member comprising an insulating element and a conducting element carried by the insulating element and normally engaging the said switch contacts to establish a circuit through the appliance, means for rectilinearly moving the switching member approximately parallelly with the front face of the base to engage the conducting element thereof with the stationary switch contacts or to disengage it therefrom, and means normally engaging the insulating element of the said switching member to prevent forward movement thereof, the said means being supported entirely by the single-piece switch contacts and being movable relatively to the said switch and fuse contacts to permit removal of the switching member in the forward direction.

23. In a fused switch appliance, the combination of an insulating base, two pairs of opposed stationary switch contacts carried by the base at the front thereof, each of the said contacts comprising a single piece of metal including a contact portion perpendicular to the front of the base and a mounting portion at right angles to the contact portion and engaging the base, a pair of spaced fuse contacts each in direct engagement with one of the said single-piece switch contacts of the corresponding pair of such contacts, a rectilinearly movable switching member comprising an insulating element and two conducting elements carried by the insulating element and normally engaging the said switch contacts of the corresponding pairs to establish a circuit through the appliance, means for rectilinearly moving the switching member approximately parallelly with the front face of the base to engage the conducting elements thereof with the stationary switch contacts or to disengage them therefrom, and means normally engaging the insulating element of the said switching member to prevent forward movement thereof, the said means being supported entirely by the single-piece switch contacts and being movable relatively to the said switch and fuse contacts to permit removal of the switching member in the forward direction.

In testimony whereof I have hereunto set my hand this 26th day of April, 1932.

JOSEPH SACHS.